United States Patent
Lin et al.

(10) Patent No.: US 12,424,558 B2
(45) Date of Patent: Sep. 23, 2025

(54) BRIDGE DIE HAVING DIFFERENT SURFACE ORIENTATION THAN IC DIES INTERCONNECTED BY THE BRIDGE DIE

(71) Applicant: Taiwan Semiconductor Manufacturing Company, Ltd., Hsin-Chu (TW)

(72) Inventors: Yu-Sheng Lin, Zhubei (TW); Chin-Fu Kao, Taipei (TW); Tsung-Yang Hsieh, Taipei (TW); Jyun-Lin Wu, Hsinchu (TW); Yao-Chun Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 501 days.

(21) Appl. No.: 17/887,150

(22) Filed: Aug. 12, 2022

(65) Prior Publication Data
US 2024/0055354 A1 Feb. 15, 2024

(51) Int. Cl.
*H01L 23/538* (2006.01)
*H01L 21/02* (2006.01)
(Continued)

(52) U.S. Cl.
CPC ...... *H01L 23/538* (2013.01); *H01L 21/02433* (2013.01); *H01L 23/145* (2013.01);
(Continued)

(58) Field of Classification Search
CPC . H01L 25/0655; H01L 25/042; H01L 25/072; H01L 25/0753; H01L 23/5381; H01L 23/5384; H01L 23/5385; H01L 23/5387; H01L 23/147; H01L 21/02433; H01L 21/02516; H01L 21/02609; H01L 33/16; H01L 23/14538–5389; H01L 23/538–5389; H01L 21/02027; H01L 2924/05432; H01L 2924/05442; H01L 2224/81894; H01L 2224/81895;
(Continued)

(56) References Cited

U.S. PATENT DOCUMENTS

| | | | |
|---|---|---|---|
| 7,564,115 B2 | 7/2009 | Chen et al. | |
| 7,633,165 B2 | 12/2009 | Hsu et al. | |

(Continued)

FOREIGN PATENT DOCUMENTS

TW    I753587 B    1/2022

OTHER PUBLICATIONS

By Larsen, Delmar. "Physical Chemistry" textbook (Compliation Year: 2024).*

*Primary Examiner* — Zandra V Smith
*Assistant Examiner* — Douglas Yap
(74) *Attorney, Agent, or Firm* — HAYNES AND BOONE, LLP

(57) ABSTRACT

A first integrated circuit (IC) die includes a first substrate. A second IC die includes a second substrate. At least one of the first substrate or the second substrate has a first surface orientation. The first IC die is spaced apart from the second IC die. A third die electrically interconnects the first IC die to the second IC die. The third die includes a third substrate having a second surface orientation. The second surface orientation is different from the first surface orientation.

20 Claims, 15 Drawing Sheets

(51) Int. Cl.
*H01L 23/00* (2006.01)
*H01L 23/14* (2006.01)
*H01L 23/15* (2006.01)
*H01L 25/065* (2023.01)

(52) U.S. Cl.
CPC ............ *H01L 23/147* (2013.01); *H01L 23/15* (2013.01); *H01L 23/562* (2013.01); *H01L 25/0655* (2013.01); H01L 24/16 (2013.01); H01L 2224/16227 (2013.01); H01L 2924/05432 (2013.01); H01L 2924/05442 (2013.01); H01L 2924/1437 (2013.01); H01L 2924/15787 (2013.01); H01L 2924/15788 (2013.01)

(58) Field of Classification Search
CPC ............................... H01L 2224/81896; H01L 2224/83894–83896; H01L 2224/187; H01L 2224/80894; H01S 5/3202; H01S 5/2201; H10F 77/16; H10D 62/405; H10H 20/817
See application file for complete search history.

(56) References Cited

U.S. PATENT DOCUMENTS

| | | | |
|---|---|---|---|
| 7,667,271 B2 | 2/2010 | Yu et al. |
| 7,825,024 B2 | 11/2010 | Lin et al. |
| 7,910,453 B2 | 3/2011 | Xu et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,377,779 B1 | 2/2013 | Wang |
| 8,399,931 B2 | 3/2013 | Liaw et al. |
| 8,426,961 B2 | 4/2013 | Shih et al. |
| 8,652,894 B2 | 2/2014 | Lin et al. |
| 8,669,174 B2 | 3/2014 | Wu et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,802,504 B1 | 8/2014 | Hou et al. |
| 8,803,292 B2 | 8/2014 | Chen et al. |
| 8,803,316 B2 | 8/2014 | Lin et al. |
| 8,816,444 B2 | 8/2014 | Wann et al. |
| 8,823,065 B2 | 9/2014 | Wang et al. |
| 8,860,148 B2 | 10/2014 | Hu et al. |
| 2003/0094674 A1* | 5/2003 | Ipposhi ............ H01L 21/76254 257/E23.179 |
| 2014/0001574 A1 | 1/2014 | Chen et al. |
| 2014/0001645 A1 | 1/2014 | Lin et al. |
| 2014/0110755 A1 | 4/2014 | Colinge |
| 2014/0151812 A1 | 6/2014 | Liaw |
| 2014/0225258 A1 | 8/2014 | Chiu et al. |
| 2014/0252572 A1 | 9/2014 | Hou et al. |
| 2018/0053730 A1* | 2/2018 | Shao .................... H01L 23/544 |
| 2019/0355670 A1* | 11/2019 | Chen .................. H01L 23/3185 |
| 2020/0273807 A1* | 8/2020 | Won .................... H01L 25/0657 |
| 2021/0118789 A1* | 4/2021 | Chu .................... H01L 23/5384 |
| 2023/0209800 A1* | 6/2023 | Sharma .................. G11C 11/41 257/776 |

\* cited by examiner

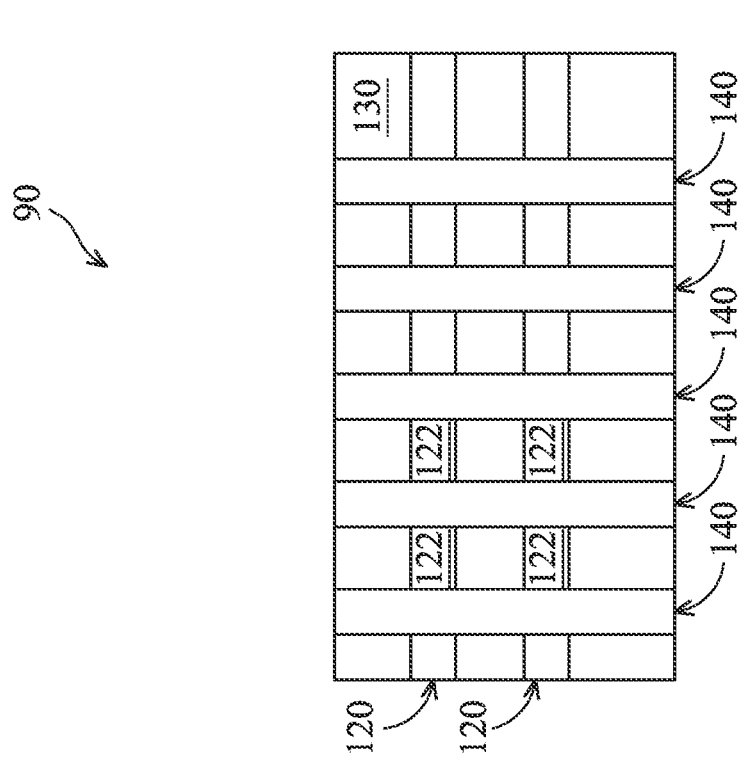
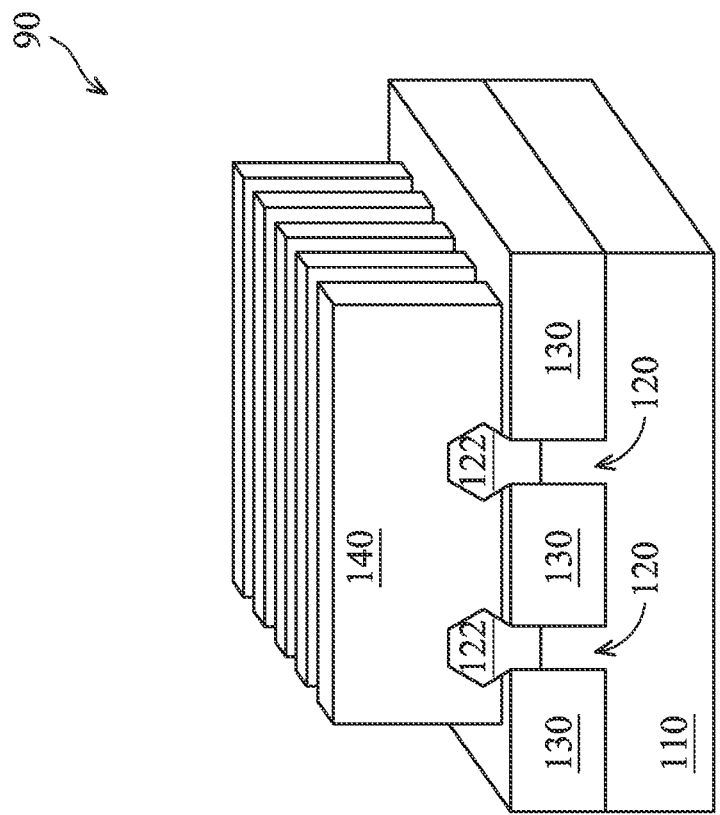
Fig. 1A
Fig. 1B

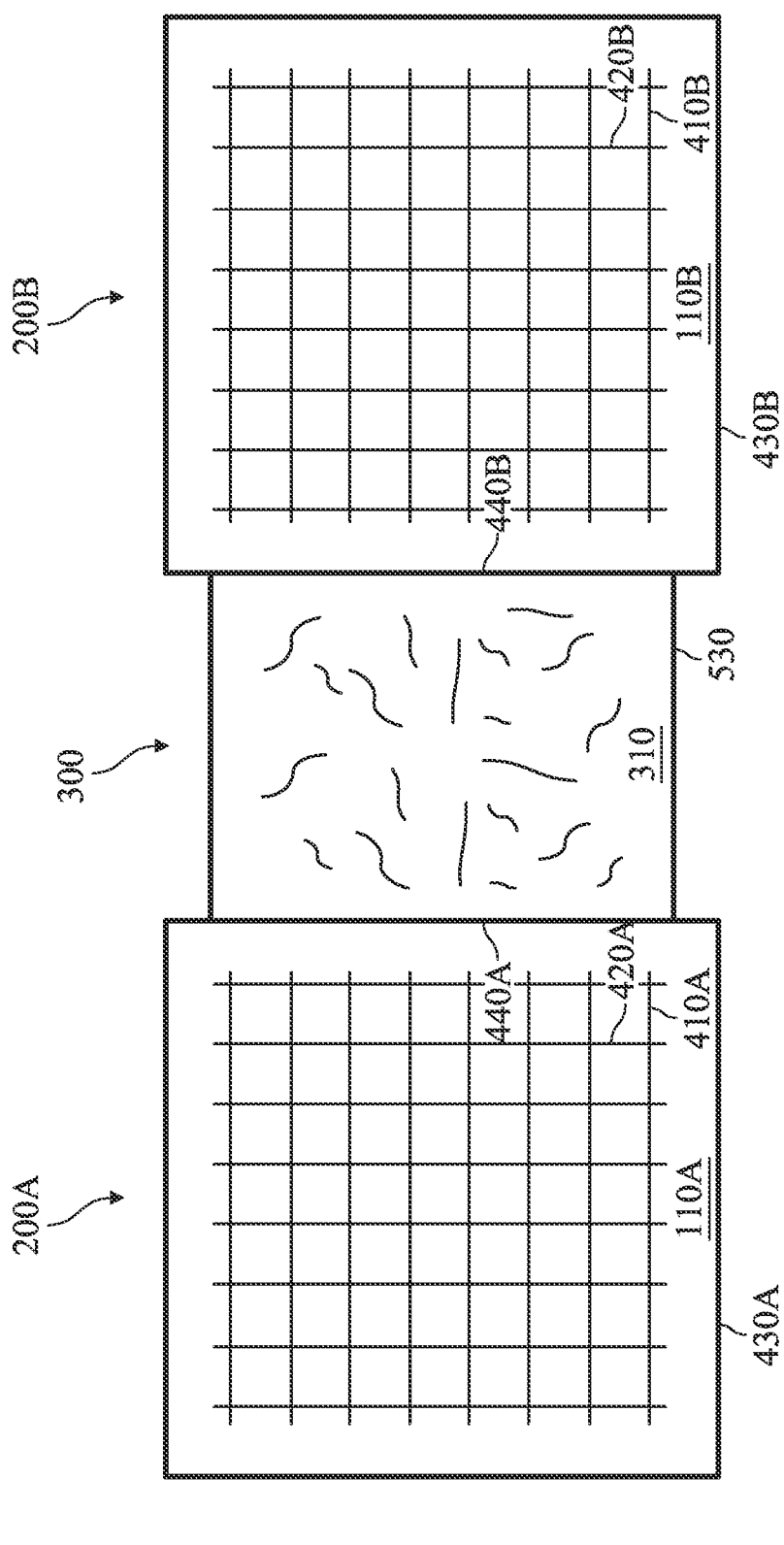

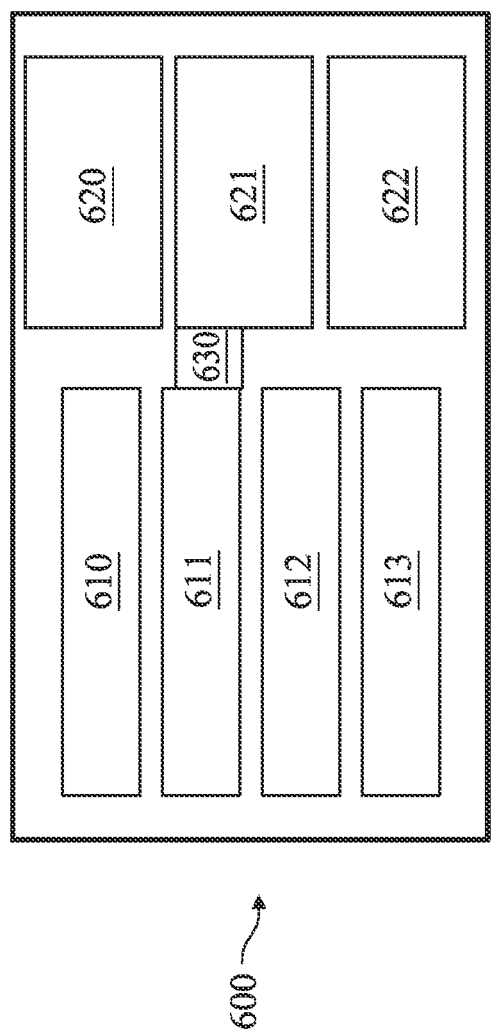
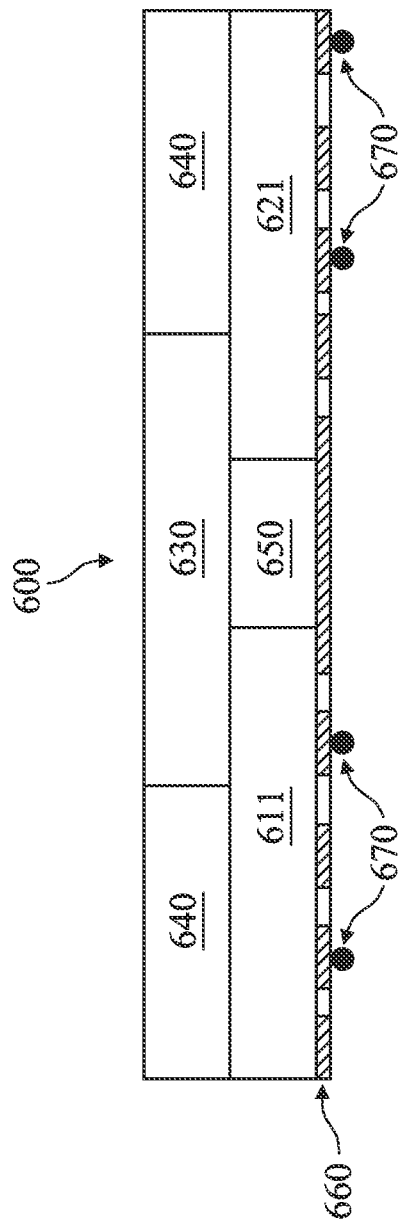
Fig. 9A
Fig. 9B

BRIDGE DIE HAVING DIFFERENT SURFACE ORIENTATION THAN IC DIES INTERCONNECTED BY THE BRIDGE DIE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, conventional semiconductor fabrication may still face certain challenges. For example, when multiple IC dies interconnected together are put under duress, structural defects such as cracking or delamination may occur. These defects may lead to a lower yield and/or degraded device performance and therefore are undesirable.

Therefore, although existing semiconductor devices and their method of fabrication have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A illustrates a three-dimensional perspective view of a FinFET device.

FIG. 1B illustrates a top view of a FinFET device.

FIG. 8 illustrates a planar top view of two IC dies interconnected together by a bridge die according to various aspects of the present disclosure.

FIGS. 9A-9B illustrate a planar top view and a cross-sectional side view of a packaging platform according to various aspects of the present disclosure.

DETAILED DESCRIPTION

Figure 1C:
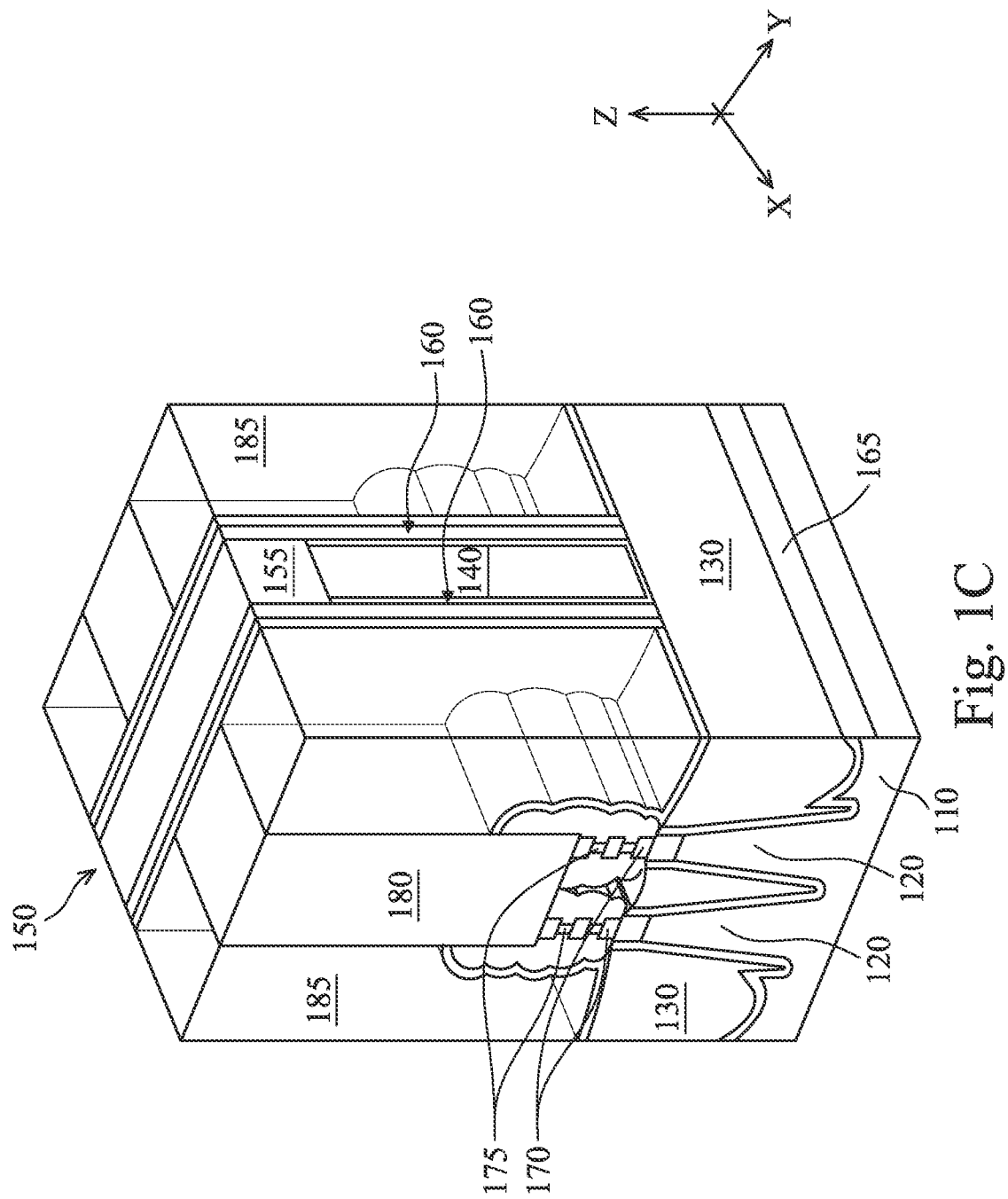
FIG. 1C illustrates a three-dimensional perspective view of a multi-channel gate-all-around (GAA) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to interconnecting IC dies together using a bridge die that has a different surface orientation that the IC dies, so as to help reduce structural defects that could otherwise occur. In more detail, a first IC die and a second IC die each contain electrical circuitry that is formed at least in part by transistors, such as FinFET transistors or gate-all-around (GAA) transistors. The first IC die and the second IC die are electrically and mechanically coupled together by the bridge die, which itself may have interconnect structures but not functional transistors. The first IC die and the second IC die may have a first surface orientation, such as a crystal lattice orientation that corresponds to a <100> miller index. Meanwhile, the bridge die has a second surface orientation different from the first surface orientation. In some embodiments, the bridge die may have a crystal lattice orientation that corresponds to a <110> miller index or a <111> miller index. In some other embodiments, the bridge die may have a non-crystal substrate and therefore does not have a crystal surface orientation. For example, the bridge die may have a ceramic substrate (e.g., a quartz substrate or a sapphire substrate), an amorphous substrate, or an organic substrate. These types of substrates allow the surface orientation of the bridge die to have a mismatch with respect to the first IC die and the second IC die. Such a mismatch may improve the structural integrity of the overall interconnected structure, such that the defects (e.g., cracking or delamination) are less likely to occur. Consequently, the yield and/or device performance may be improved.

The various aspects of the present disclosure will now be discussed below. Referring now to FIGS. 1A and 1B, a three-dimensional perspective view and a top view of a portion of an Integrated Circuit (IC) device 90 are illustrated, respectively. The IC device 90 is implemented using FinFETs, which include semiconductor fin structures that protrude vertically out of a substrate. The fin structures are active regions, from which source/drain regions and/or channel regions are formed. The gate structures partially wrap around the fin structures. In more detail, as shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structures 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example GAA device 150, which have multiple elongated nano-structure channels that may be implemented as nano-tubes, nano-sheets, or nano-wires. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material. The FinFET devices and GAA devices may be electrically interconnected using metallization components such as metal lines and conductive vias/contacts.

Figure 2:
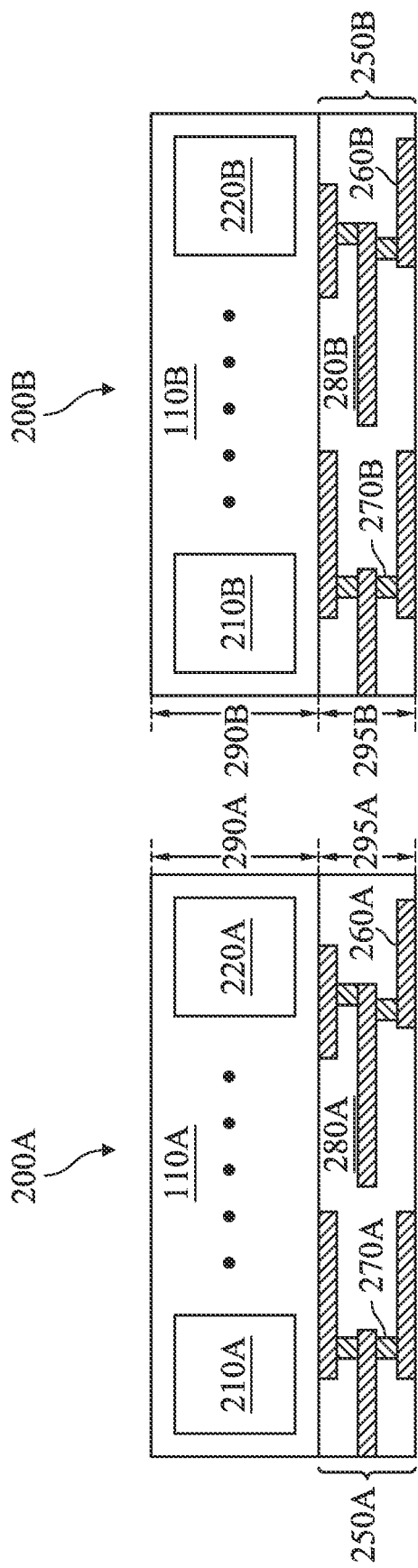
FIG. 2 illustrates a cross-sectional view of two IC dies according to various aspects of the present disclosure.

Transistors such as the FinFET devices and the GAA devices discussed above may be used to implement the electrical circuitries in IC dies. For example, FIG. 2 illustrates a diagrammatic fragmentary cross-sectional view of an IC die 200A and an IC die 200B. The IC die 200A includes a substrate 110A, which may be an embodiment of the substrate 110 discussed above with reference to FIGS. 1A and 1C. The substrate 110A may have a crystal semiconductor material composition and has a first surface orientation. In some embodiments, the first surface orientation is a crystal lattice orientation corresponding to a <100> miller index. Various electrical circuitries may be formed in or on the substrate 110A. For reasons of simplicity, the electrical circuitries are illustrated as electrical circuitries 210A and 220A. It is understood that the electrical circuitries 210A-220B may be implemented using the FinFET devices and/or the GAA devices discussed above.

The IC die 200A also includes an interconnect structure 250A that is formed on the substrate 110A. The interconnect structure 250A includes a plurality of patterned dielectric layers and interconnected conductive layers. These interconnected conductive layers provide interconnections (e.g., wiring) between circuitries, inputs/outputs, and various doped features formed in the substrate 110A. For example, the interconnect structure 250A may include a plurality of interconnect layers, also referred to as metal layers (e.g., M1, M2, M3, etc). Each of the interconnect layers includes a plurality metal lines, such as metal lines 260A. The interconnect structure 250A may also include a plurality of conductive vias, such as conductive vias 270A, that electrically couple the various metal lines 260A together. The metal lines 260A and the conductive vias 270A may contain aluminum, copper, aluminum alloy, copper alloy, aluminum/silicon/copper alloy, titanium, titanium nitride, tantalum, tantalum nitride, tungsten, cobalt, ruthenium, metal silicide, or combinations thereof. The interconnect structure 250A also includes an interlayer dielectric (ILD) 280A that provides electrical and physical isolation between the interconnect layers. The ILD may include a dielectric material such as an oxide material.

Similarly, the IC die 200B includes a substrate 110B in which electrical circuitries 210B and 220B are formed. The substrate 110B may also have a crystal semiconductor material composition and has a crystal lattice surface orientation. In some embodiments, the crystal lattice surface orientation of the substrate 110B is the same as that of the substrate 110A (e.g., they both have a <100> miller index). In alternative embodiments, the substrate 110B and the substrate 110A may have different crystal lattice surface orientations. As is the case with the IC die 200A, the electrical circuitries 210B and 220B may also be implemented using the FinFET devices and/or the GAA devices discussed above.

The IC die 200B also include an interconnect structure 250B that is formed on the substrate 110B. The interconnect structure 250B also includes a plurality of interconnect layers that are comprised of metal lines 260B and conductive vias 270B, which are electrically and physically insulated by an ILD 280B.

The IC die 200A and the IC die 200B may include a variety of IC applications. As a non-limiting example, the IC die 200A and/or the IC die 200B may be electronic memory devices, such as static random access memory (SRAM) devices or dynamic random access memory (DRAM) devices. As another example, the IC die 200A and/or the IC die 200B may be communication devices, such as transceivers, modulator demodulators (modems), radio frequency (RF) devices, RF identification (RFID) devices, etc. As another example, the IC die 200A and/or the IC die 200B may be computer processors, such as central processing units (CPUs) or graphical processing units (GPUs). As other examples, the IC die 200A and/or the IC die 200B may be microcontrollers or satellite positioning devices (e.g., global positioning systems, or GPS). In further examples, the IC die 200A and/or the IC die 200B may be custom-designed devices, such as Application Specific Integrated Circuits (ASICs). It is understood that the IC die 200A and the IC die 200B may be the same type of IC device in some embodiments, or they may be different types of IC devices in other embodiments.

Although it may not be readily apparent (since FIG. 2 is not drawn in scale), the substrates 110A and 110B are in fact substantially thicker than their respective interconnect structures 250A and 250B. For example, the substrate 110A has a thickness 290A, the substrate 110B has a thickness 290B, the interconnect structure 250A has a thickness 295A, and the interconnect structure 250B has a thickness 295B. The thicknesses 290A, 290B, 295A, and 295B are all measured in a vertical direction (e.g., the Z-direction of FIGS. 1A and 1C). The thickness 290A and the thickness 290B may be at least five times thicker than the thicknesses 295A and 295B. For example, the thickness 290A and the thickness 290B may be in the range of several tens of microns, while the thickness 295A and the thickness 295B may be in the order of just a few microns. In some embodiments, the thickness 290A and the thickness 290B may each be in a range between about 30 microns and about 40 microns, while the thickness 295A and the thickness 295B may each be in a range between about 0.5 micron and about 5 microns. Note that the thickness 290A need not be equal to the thickness 290B, and that the thickness 295A need not be equal to the thickness 295B, since the IC dies 200A and 200B may be different from each other in various embodiments.

Figure 3:
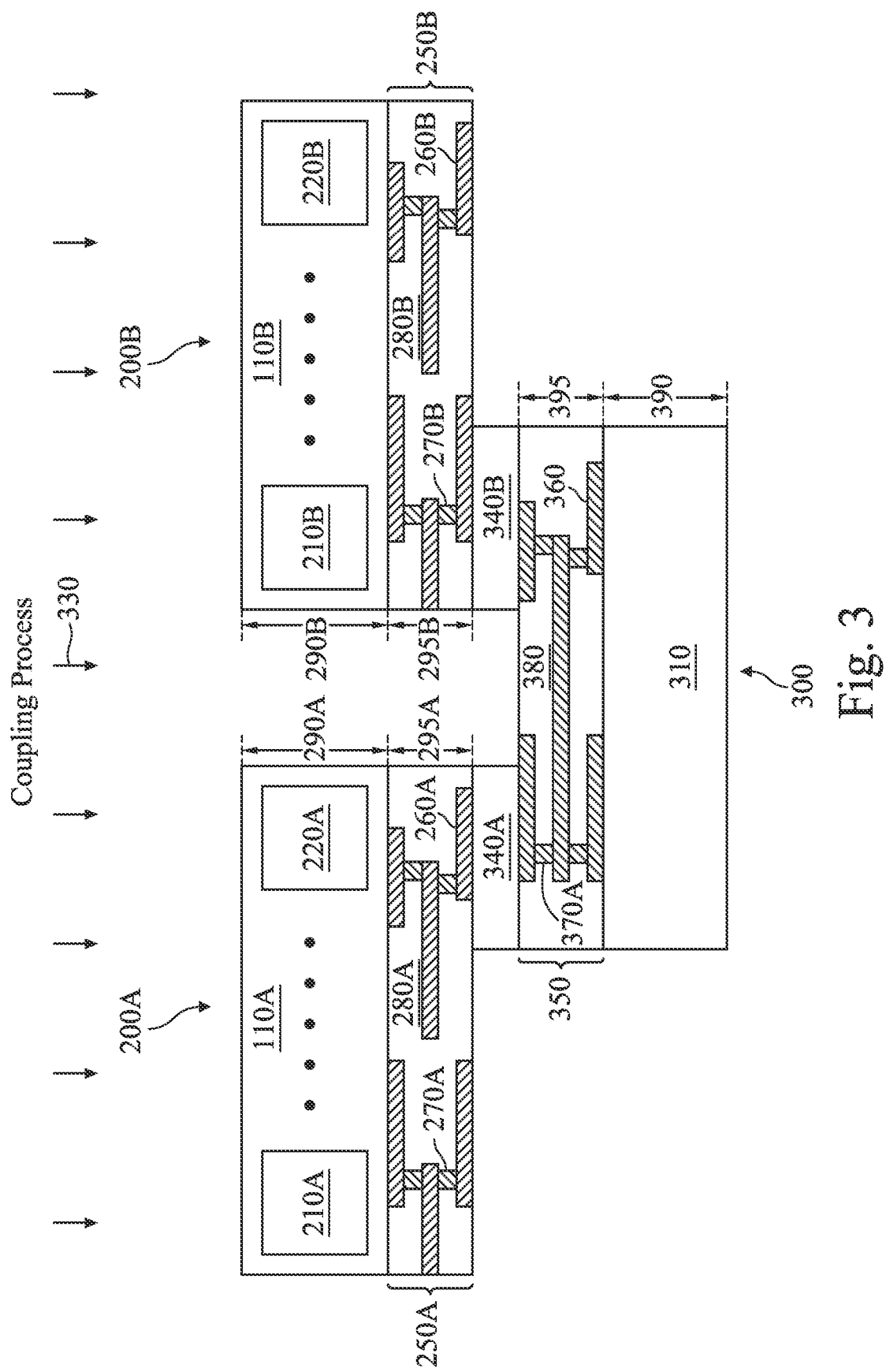
FIG. 3 illustrates a cross-sectional view of two IC dies interconnected together by a bridge die according to various aspects of the present disclosure.

Referring now to FIG. 3, a bridge die 300 is provided and bonded to the IC die 200A and the IC 200B through a coupling process 330. In more detail, the bridge die 300 includes a substrate 310 and an interconnect structure 350 formed on the substrate 310. Similar to the interconnect structures 250A and 250B, the interconnect structure 350 includes a plurality of interconnect layers that contain metal lines (e.g., metal lines 360) that are interconnected by conductive vias (e.g., conductive vias 370), where an ILD 380 provides electrical and physical isolation for the metal lines 360 and vias 370. The bonding process 330 bonds a first portion of the interconnect structure 350 to the interconnect structure 250A through a conductive element 340A. The bonding process 330 also bonds a second portion of the interconnect structure 350 to the interconnect structure 250B through a conductive element 340B. In some embodiments, the conductive elements 340A and 340B include bonding bumps, solder balls, or solder joints. Since the conductive elements 340A and 340B are electrically conductive, as are the metal lines 360 and the conductive vias 370 of the interconnect structure 350, the bridge die 300 can effectively provide electrical connections between the IC dies 200A and 200B, for example, between the electrical circuitries 210A-220A and the electrical circuitries 210B-220B.

Note that the substrate 310 itself need not have electrical circuitries embedded therein. For example, the substrate 310 may be free of transistors in some embodiments. The lack of transistors in the substrate 310 does not interfere with the functionalities of the bridge die 300, since the bridge die 300 is mostly used to electrically connect the IC dies 200A and 200B together. In fact, the absence of functional transistors in the substrate 310 makes its fabrication easier, since it need not be concerned with causing potential damage to the transistors that are not there.

Figure 4:
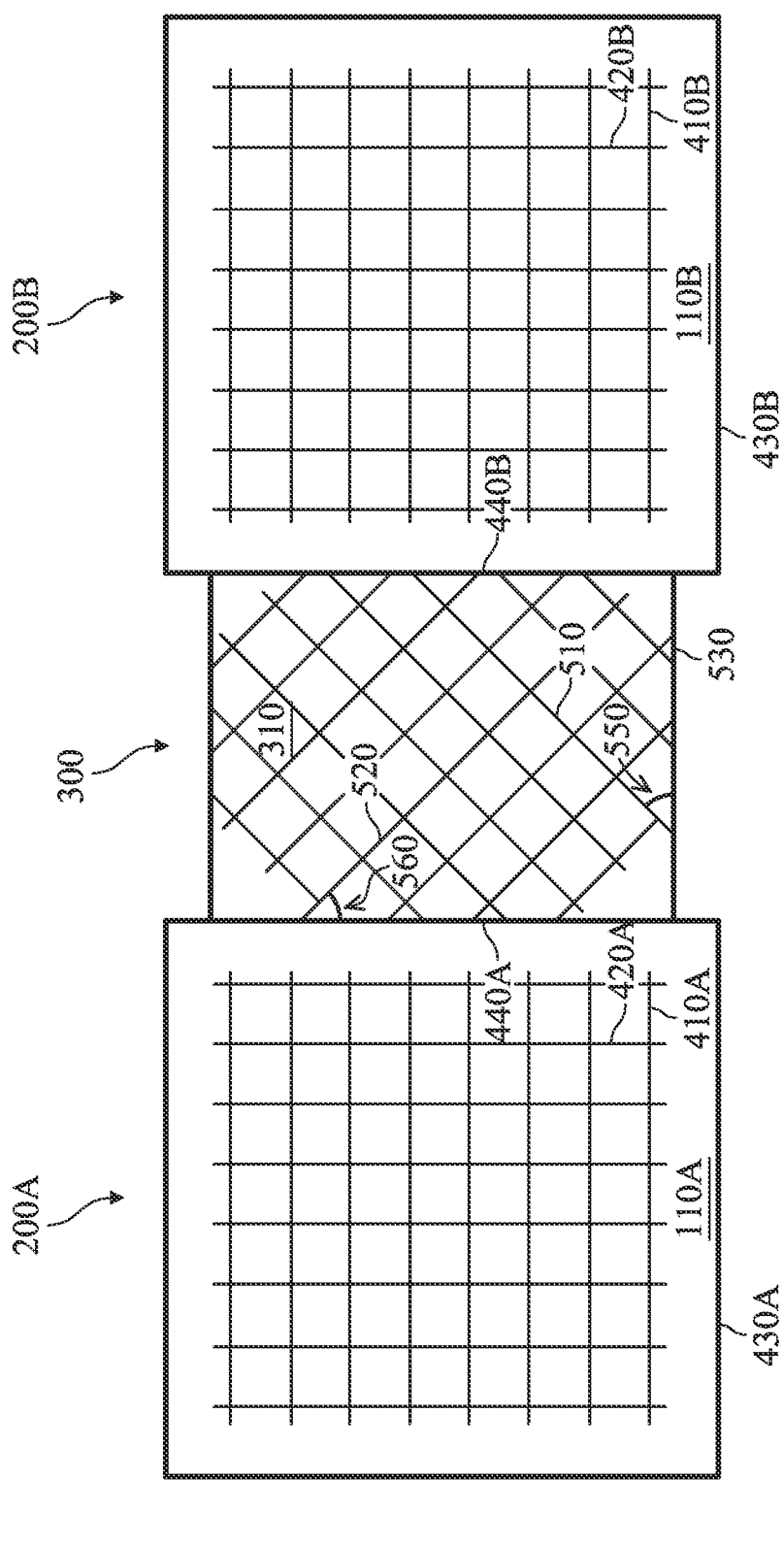
FIG. 4 illustrates a planar top view of two IC dies interconnected together by a bridge die according to various aspects of the present disclosure.

One of the unique physical traits of the present disclosure is that the substrate 310 of the bridge die 300 has a different surface orientation than the substrates 110A and 110B. FIG. 4 illustrates one example embodiment of this difference in surface orientations. In more detail, FIG. 4 illustrates a top view of the substrate 310 of the bridge die 300 and the substrates 110A and 110B of the IC dies 200A and 200B, respectively. The top view corresponds to a horizontal plane that is defined by the X-direction and the Y-direction discussed above. The top view of FIG. 4 provides a two-dimensional illustration of the surface orientation of the substrates 110A, 110B, and 310. In that regard, the surface orientation of a plane may refer to how the plane intersects the main crystallographic axes of a solid material, which in this case is the substrate 110A or the substrate 110B. A crystal structure of the solid material may refer to the geometric arrangement of the particles in the unit cells of the solid material, where the unit cell is the smallest repeating unit having a full symmetry of the crystal structure. The structural arrangement of the unit cells of a given crystal lattice may be described by a Miller index.

In the case of the substrates 110A and 110B, they may have a crystal lattice orientation that corresponds to a <100> Miller index. In the top view of FIG. 4, such a surface orientation (e.g., corresponding to the <100> Miller index) may be crudely represented visually by a plurality of axes 410A and a plurality of axes 420A that intersect with each other orthogonally (in the case of the substrate 110A), and by a plurality of axes 410B and a plurality of axes 420B that intersect with each other orthogonally (in the case of the substrate 110B). The axes 410A each extend in a direction parallel to an edge 430A of the IC die 200A, and the axes 420A each extend in a direction parallel to an edge 440A of the IC die 200A. The axes 410B each extend in a direction parallel to an edge 430B of the IC die 200B, and the axes 420B each extend in a direction parallel to an edge 440B of the IC die 200B. The directions of the axes 410A/410B and 420A/420B indicate that the unit cells of the crystal material of the substrates 110A and 110B are aligned with one another in directions that are parallel to the edges 430A/430B and 440A/440B of their respective IC dies 200A and 200B.

In the illustrated embodiment, the IC dies 200A and 200B are each configured as having a rectangular top view profile, and they are each oriented in a manner such that the edges 430A/430B each extend along the X-direction, and the edges 440A/440B each extend along the Y-direction. As such, the <100> Miller index in the illustrated embodiment of FIG. 4 is partially manifested visually by the axes 410A/410A extending in the X-direction, and the axes 420A/420B extending in the Y-direction.

In comparison, the substrate 310 of the bridge die 300 does not have a surface orientation that corresponds to the <100> Miller index. Instead, the substrate 310 has a surface orientation that corresponds to a <110> Miller index in the embodiment of FIG. 4. Such a surface orientation of the substrate 310 is crudely represented visually by a plurality of axes 510 and a plurality of axes 520 that intersect with each other orthogonally. The axes 510 and 520 each extend diagonally with respect to an edge 530 of the bridge die 300, as well as with respect to the edges 440A and 440B of the IC dies 200A and 200B. For example, the axis 510 may intersect with the edge 530 of the bridge die, such that an angle 550 is defined collectively by the axis 510 and the edge 530. The angle 550 is between 0 degrees and 90 degrees. In some embodiments, the angle 550 is between 40 degrees and 50 degrees, for example, 45 degrees. Similarly, the axis 520 may intersect with the edge 440A of the IC die 200A (as well as with the edge 440B of the IC die 200B), such that an angle 560 is defined collectively by the axis 520 and the edge 440A (or the edge 440B). The angle 560 is between 0 degrees and 90 degrees. In some embodiments, the angle 560 is between 40 degrees and 50 degrees, for example, 45 degrees.

The different surface orientations between the substrate 310 of the bridge die 300 and the substrates 110A/110B of the IC dies 200A/200B helps reduce the stress of the overall structure formed by the IC dies 200A/200B and the bridge die 300. In that regard, various forces or stresses may be applied to such an overall structure during the fabrication or the use thereof, for example, by fabrication tools, by differences in coefficient of thermal expansion (CTE) between the components of the overall structure, or by gravity. These forces or stresses may lead to certain defects such as cracking or delamination. However, the stress experienced by the overall structure is reduced by the difference in surface orientations between the substrate 310 and the substrates 110A and 110B.

For example, since the axes 510/520 extend in different directions (e.g., diagonally) from the axes 410A/410B and 420A/420B, it is more difficult for a crack or delamination to continue from one of the IC dies 200A/200B to the bridge die 300, or vice versa. In other words, the diagonal structural arrangement of the unit cells of the substrate 310 of the bridge die 300 can block a propagation of a potential breakage in the unit cells of the substrates 110A/110B, or at least increase the tolerance of high energy. Advantageously, this helps to reduce defects such as cracking or delamination, increase device yield, and/or enhance device performance.

Figure 5B:
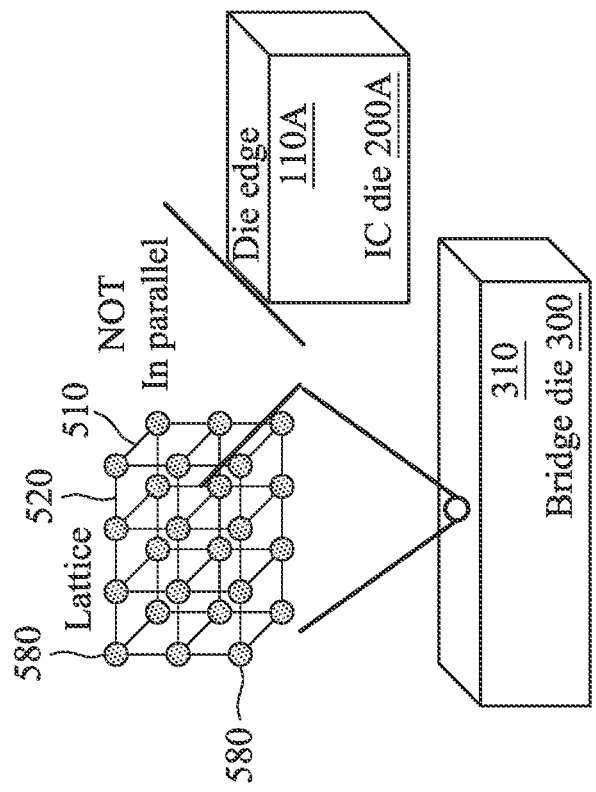
FIGS. 5A-5B illustrate three-dimensional perspective views of an IC die and a bridge die according to various aspects of the present disclosure.
Figure 5A:
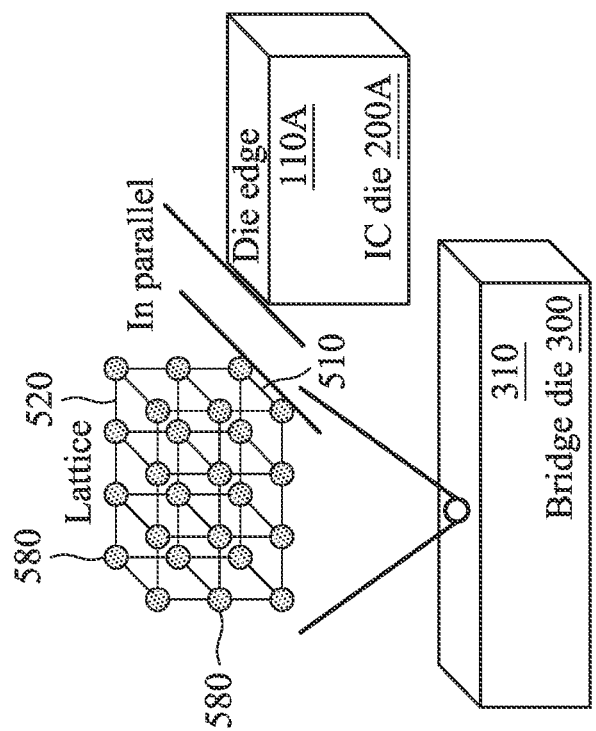

The above concept is further illustrated in FIGS. 5A-5B, which is a simplified fragmentary three-dimensional perspective view of the bridge die 300 and one of the IC dies 200A. In more detail, FIG. 5A corresponds to a hypothetical scenario where the substrate 310 of the bridge die 300 has been implemented with the same surface orientation as the substrate 110A of the IC die 200A, which in this case corresponds to a <100> Miller index. In contrast, FIG. 5B corresponds to the embodiment of FIG. 4 where the substrate 310 of the bridge die 300 has been implemented with a different surface orientation than the substrate 110A of the IC die 200A. For example, the substrate 110A has a surface orientation that corresponds to a <100> Miller index, while the substrate 310 has a surface orientation that corresponds to a <110> Miller index.

The crystal lattice structure of the substrate 310 of the bridge die is also illustrated in a simplified three-dimensional form in FIGS. 5A and 5B. The crystal lattice structure illustrates how a plurality of unit cells 580 are arranged with respect to one another, for example, by being aligned with adjacent unit cells 580 along the axis 510 or along the axis 520. In the hypothetical scenario of FIG. 5A, the axis 510 is substantially parallel to one of the edges of the IC die 200A, while the axis 520 is substantially parallel to another one of the edges of the IC die 200A. Although not illustrated herein, the crystal lattice structure of the substrate 110A of the IC die 200A has the same arrangement as the crystal lattice structure illustrated in FIG. 5A. That is, it also has axes that are parallel to the edges of the IC die 200A. As such, not much energy would be applied to cause a break or delamination in the bridge die 300 and/or in the IC die 200A.

In contrast, the axis 510 and the axis 520 of the crystal lattice structure of FIG. 5B are oriented in a manner such that they are not in parallel with the edges of the IC die 200A. For example, the axes 510 and 520 may extend diagonally with respect to the edges of the IC die 200A. As such, more energy would be applied to cause a break or delamination in the bridge die 300 and/or in the IC die 200A. Consequently, the embodiment of FIG. 5B offers enhanced mechanical strength and a greater degree of stress tolerance, thereby reducing device defects and improving device yield or performance.

The enhanced mechanical strength and stress tolerance (e.g., due to the substrate 310 and the substrates 110A-110B having mismatched surface orientations) also means that the substrate 310 can be relatively thin compared to the substrates 110A and 110B. For example, referring back to the cross-sectional view of FIG. 3, the substrate 310 has a thickness 390 in a vertical direction (e.g., the Z-direction discussed above). In some embodiments, the thickness 390 is in a range between about 20 microns and about 40 microns, and a ratio of the thickness 290A (of the IC die 200A) and the thickness 390 is in a range between about 5:1 and about 40:1. In comparison, had the bridge die 300 been made to have the same surface orientation as the IC dies 200A and 200B, then the bridge 300 would have a thicker substrate 310 with a greater value of the thickness 390, such that the ratio of the thickness 290A and the thickness 390 is in a range between about 5:1 and about 40:1, since a thicker bridge die 300 would have been applied to ensure the mechanical integrity and stress tolerance of the overall structure. However, a thicker bridge die 300 would have consumed more chip space (e.g., in the vertical direction), which would have been undesirable. In contrast, the reduction in the thickness of the bridge die 300 herein may lead to a smaller (e.g., thinner) overall structure, which conserves valuable chip space in the vertical dimension.

Also as shown in FIG. 3, the interconnect structure 350 has a thickness 395 in the vertical direction. In some embodiments, a ratio of the thickness 390 (of the substrate 310) and the thickness 395 is in a range between about 0.2:1 and about 2:1. Due to the thinner substrate 310 (compared to the substrates of conventional bridge dies), the ratio of the thickness 390 and the thickness 395 may be smaller than the corresponding ratio of a conventional bridge die.

It is noted that the above ranges of the ratio between the thicknesses 390A and 390 and the ratio between the thicknesses 390 and 395 are not randomly chosen but rather specifically configured to optimize the overall structure. The values of the above ratios are directly correlated to the value of the thickness 390 of the substrate 310. Had the thickness 390 been too high, while it would still ensure the mechanical integrity and the stress tolerance of the overall structure, the cost is wasted chip space. In other words, the thicker substrate 310 would needlessly occupy vertical space within the chip, thereby resulting in a bigger-than-necessary chip. On the other hand, had the thickness 390 been too low, it may not provide a sufficient amount of mechanical integrity and/or stress tolerance for the overall structure. In other words, if the thickness 390 is too low, then even the mismatched surface orientations between the substrates 310 and 110A/110B may not offer a sufficient amount of mechanical strength and/or stress tolerance for the overall structure. Here, the thickness 390 is configured to have an optimal value range, so that it is thick enough to provide the mechanical integrity and stress tolerance for the overall structure, and yet not occupy vertical chip space needlessly.

Although FIG. 4 illustrates an embodiment where the substrate 310 of the bridge die 300 has a surface orientation that corresponds to the <110> Miller index, such a surface orientation is not intended to be limiting. In another embodiment, the substrate 310 may have a surface orientation that corresponds to a <111> Miller index. Other crystal lattice surface orientations may be implemented as well, as long as they have different Miller index values than that of the substrates 110A and 110B.

Figure 6:
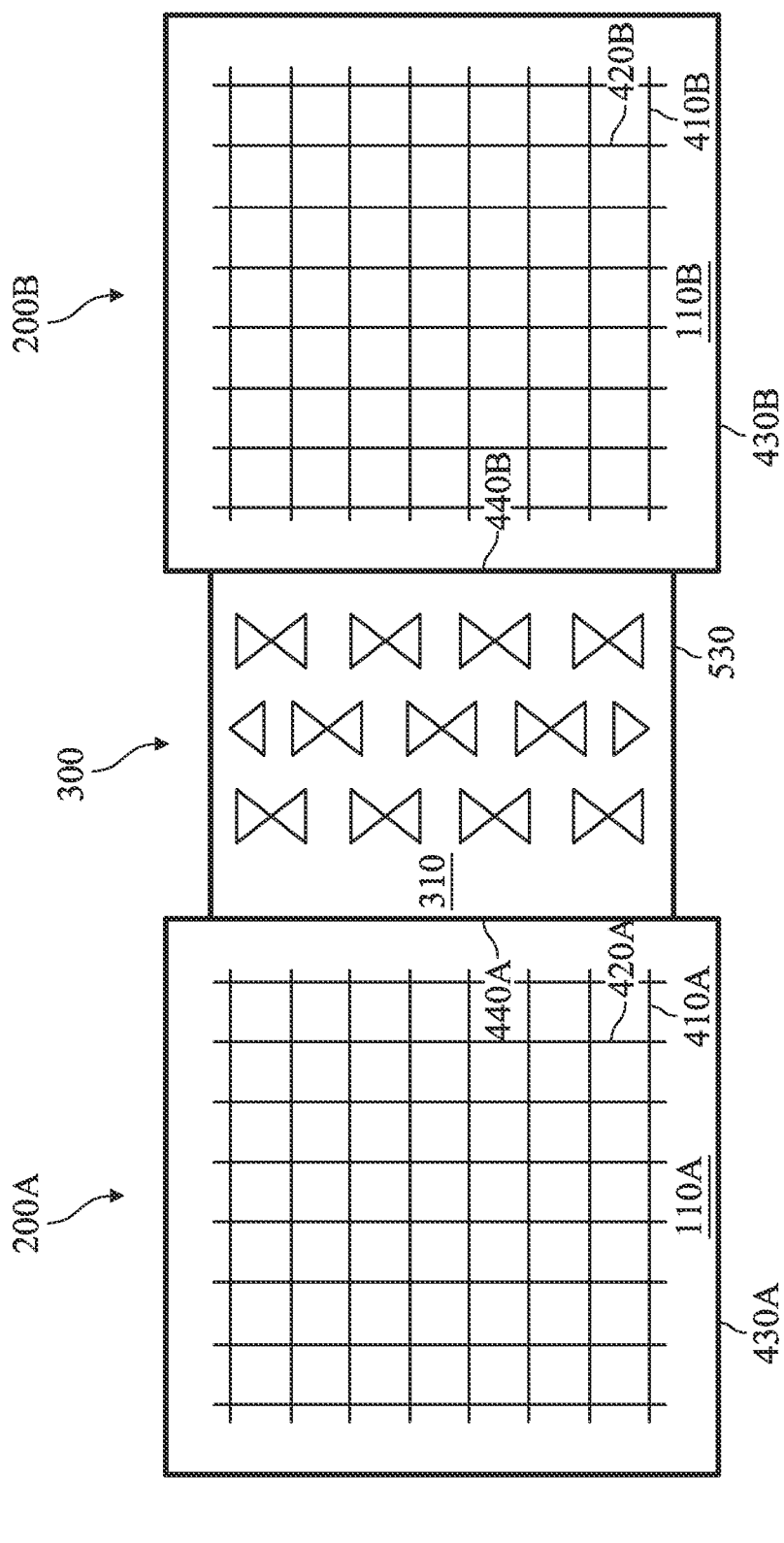
FIG. 6 illustrates a planar top view of two IC dies interconnected together by a bridge die according to various aspects of the present disclosure.
Figure 7B:
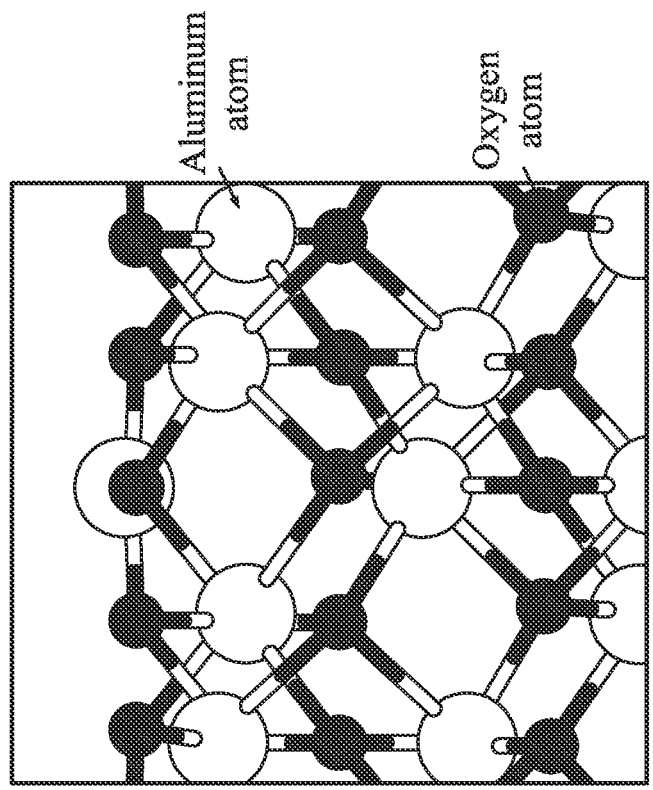
FIGS. 7A-7B illustrate example molecular structural arrangements of a substrate of a bridge die according to various aspects of the present disclosure.
Figure 7A:
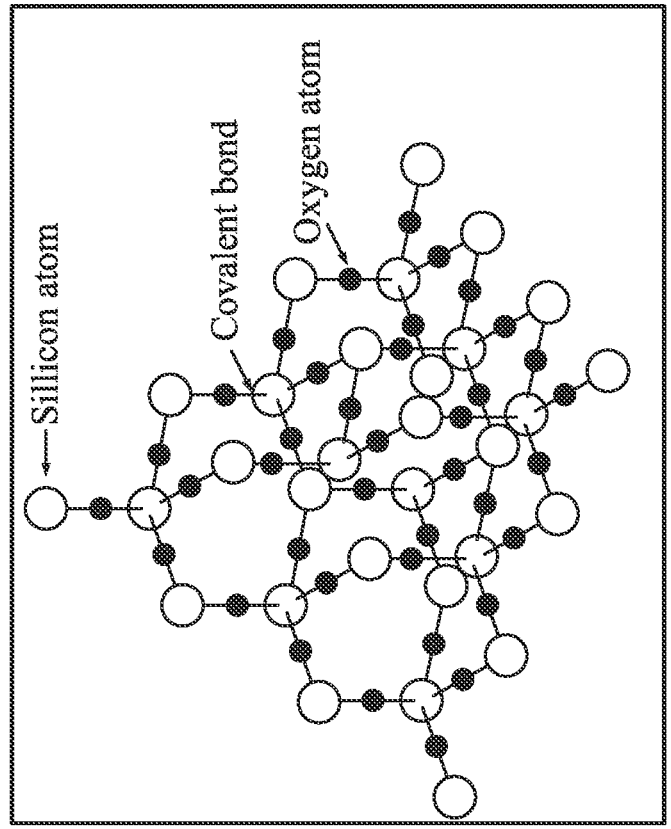

FIG. 6 illustrates the top view of the IC dies 200A-200B coupled together by the bridge die 300 according to another embodiment of the present disclosure. For reasons of consistency and clarity, similar components appearing in FIGS. 4 and 6 are labeled the same. In the embodiment of FIG. 6, the IC dies 200A and 200B are substantially the same as the IC dies 200A and 200B of FIG. 4. However, the substrate 310 of the bridge die 300 is not a crystal semiconductor material and therefore does not have a crystal lattice structure. In some embodiments, the substrate 310 has a ceramic material composition. For example, the substrate 310 may be a quartz substrate that contains $SiO_2$, or it may be a sapphire substrate that contains $Al_2O_3$. The molecular structural arrangement of the quartz substrate is illustrated in FIG. 7A, and the molecular structural arrangement of the sapphire substrate is illustrated in FIG. 7B, where FIGS. 7A and 7B are fragmentary perspective three-dimensional views. FIG. 7A illustrates how the silicon atoms and the oxygen atoms of the quartz substrate are bonded together, for example, via covalent bonds. Similarly, FIG. 7B illustrates how the aluminum atoms and the oxygen atoms of the sapphire substrate are bonded together.

Note that the top view representation of the quartz material and the sapphire material may be too complex to be accurately shown in the top view of FIG. 6. Therefore, the substrate 310 in the top view of FIG. 6 is shown as merely having a plurality of abstract geometric patterns, which may not accurately correspond to the actual top view of the molecular structural arrangement of the quartz material or sapphire material.

Regardless of the specific implementation of the substrate 310 (e.g., whether it is implemented as the quartz substrate or the sapphire substrate), the substrate 310 still does not have the same surface orientation as the substrates 110A and 110B. As such, for reasons similar to those discussed above with reference to FIGS. 4 and 5A-5B, a greater amount of energy would still be applied to cause defects such as cracking, breaking, or delamination. In other words, the surface orientation corresponding to the quartz implementation or the sapphire implementation for the substrate 310 still offers similar benefits as the implementation where the substrate 310 has the <110> or <111> Miller index, namely, enhanced mechanical strength, increased yield, and/or improved device performance. In addition, ceramic materials such as quartz or sapphire typically offer a greater hardness than a crystal semiconductor material, and thus the implementation of the substrate 310 as a ceramic substrate may further reduce the occurrence of potential defects such as cracking or delamination.

FIG. 8 illustrates the top view of the IC dies 200A-200B coupled together by the bridge die 300 according to another embodiment of the present disclosure. For reasons of consistency and clarity, similar components appearing in FIGS. 4 and 8 are labeled the same. In the embodiment of FIG. 8, the IC dies 200A and 200B are substantially the same as the IC dies 200A and 200B of FIG. 4. However, the substrate 310 of the bridge die 300 is not a crystal semiconductor material and therefore does not have a crystal lattice structure. In some embodiments, the substrate 310 has an amorphous material composition. For example, the substrate 310 may be a glass substrate or contains a glass material. In some other embodiments, the substrate 310 has an organic material composition. For example, the substrate 310 may be a polymer substrate or contains a polymer material.

Note that the top view representation of the amorphous material or the organic material may be too complex to be accurately shown in the top view of FIG. 8. Therefore, the substrate 310 in the top view of FIG. 8 is shown as merely having a plurality of curves, which may not accurately correspond to the actual top view of the molecular structural arrangement of the amorphous material or organic material.

Regardless of the specific implementation of the substrate 310 (e.g., whether it is implemented as the amorphous substrate or the organic substrate), the substrate 310 may not have the same surface orientation as the substrates 110A and 110B. As such, for reasons similar to those discussed above with reference to FIGS. 4 and 5A-5B, a greater amount of energy may be applied to cause defects such as cracking, breaking, or delamination. In other words, the surface orientation corresponding to the amorphous implementation or the organic implementation for the substrate 310 still offers similar benefits as the implementation where the substrate 310 has the <110> or <111> Miller index, namely, enhanced mechanical strength, increased yield, and/or improved device performance.

Note that in both the embodiments of FIG. 5 and FIG. 8, the substrate 310 still does not include functional electrical circuitries or transistors. Again, the purpose of the bridge die 300 is to facilitate the electrical communication between the IC dies 200A and 200B, which is handled by the interconnect structure 350 of the bridge die 300 in conjunction with the interconnect structures 250A and 250B of the IC dies 200A and 200B. The substrate 310 provides mechanical support for the interconnect structure 350, and therefore the lack of electrical circuitries or transistors within the substrate 310 is not a problem.

The bridge die 300 may be deployed in a variety of packaging platform. FIGS. 9A and 9B illustrates a diagrammatic fragmentary cross-sectional side view and a diagrammatic fragmentary top view of such a packaging platform 600, respectively. The packaging platform 600 may include a three-dimensional IC structure that includes a plurality of IC dies. For example, as shown in the top view, the packaging platform 600 includes IC dies 610, 611, 612, and 613, as well as IC dies 620, 621, and 622. In some embodiments, the IC dies 610-613 may be a first type of IC dies, while the IC dies 620-622 may be a second type of IC dies different from the first type. Any one of the IC dies 610-613 may be electrically coupled to any one of the IC dies 620-622 using a bridge die 630. For example, the IC die 611 may be electrically coupled to the IC die 621 through the bridge die 630. In that sense, it may be said that the IC die 611 may be an embodiment of the IC die 200A discussed above, the IC die 621 may be an embodiment of the IC die 200B discussed above, and the bridge die 630 may be an embodiment of the bridge die 300 discussed above. Note that although one bridge die 630 is implemented in this example embodiment, two or more bridge dies 630 may be implemented in other embodiments, for example, to provide electrical connections between other ones of the IC dies 610-613 and the other ones of the IC dies 620-622 (e.g., between the IC dies 612 and 622), or to provide further electrical connections between the IC die 611 and the IC die 621.

The coupling between the bridge die 630 and the IC dies 611 and 621 is further illustrated in the cross-sectional view of FIG. 9B. The bridge die 630 may be laterally surrounded by a packaging material 640, for example, a polymer material. The gap between the IC dies 611 and 621 may further be filled by a packaging material 650, which may also be a polymer material. An interconnect structure 660 may be formed on the surfaces of the IC dies 611-621 opposite the bridge die 630 to provide electrical access to the IC dies 611-621. The interconnect structure 660 may include one or more metal layers containing metal lines and vias for electrical routing. A plurality of conductive bumps (e.g., solder balls) 670 may be implemented on the interconnect structure 660, such that the packaging platform 600 may be connected to other external devices at least in part through the conductive bumps 670.

The bridge die 630 has a substrate that has a different surface orientation from the substrates of the IC dies 611-621. For example, whereas the IC dies 611-621 may have substrates that have the surface orientation corresponding to the <100> Miller index, the bridge die 630 may have a substrate that has a surface orientation corresponding to the <110> Miller index or the <111> Miller index, or a ceramic substrate containing a quartz material or a sapphire material, or an amorphous substrate, or an organic substrate. As discussed above, due to the mismatch in the surface orientations between the substrates of the IC dies 611-621 and the bridge die 630, the packaging platform 600 may have reduced defects, increased yield, and/or improved device performance.

Figure 10:
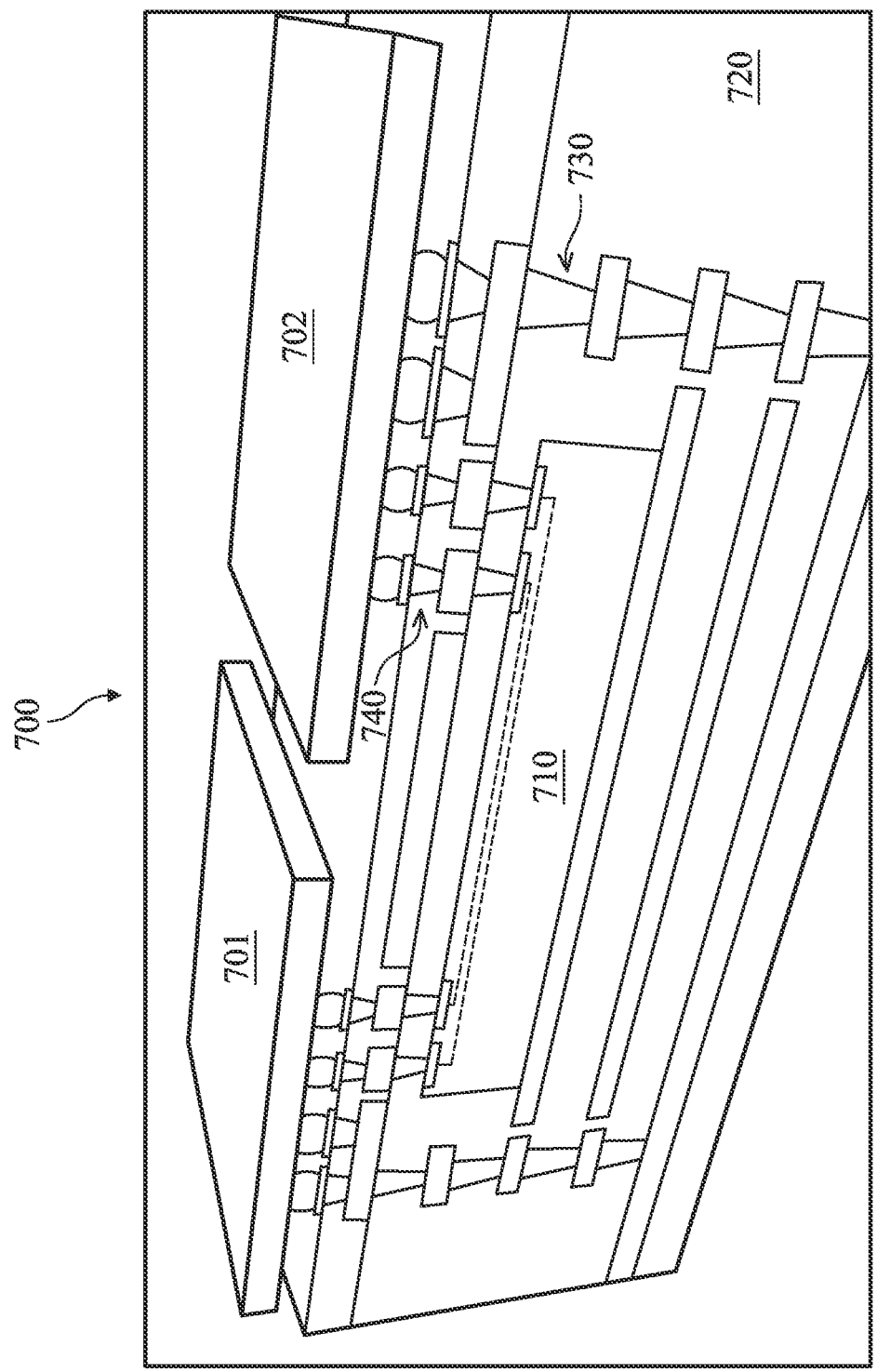
FIG. 10 illustrates a three-dimensional perspective view of another packaging platform according to various aspects of the present disclosure.

FIG. 10 illustrates a fragmentary three-dimensional perspective view of another packaging platform 700 in which a bridge die is implemented according to the various aspects of the present disclosure discussed above. The packaging platform 700 includes an IC die 701 and an IC die 702, which may be implemented as embodiments of the IC dies 200A and 200B discussed above, respectively. The IC dies 701-702 may be the same type of IC dies in some embodiments, or they may be different types of IC dies in other embodiments. The IC dies 701-702 are electrically coupled together by a bridge die 710, which may be implemented as an embodiment of the bridge die 300 discussed above.

As shown in FIG. 10, the bridge die 710 is embedded in a packaging material 720, which may include a polymer material or a dielectric material. The IC dies 701-702 are located over the packaging material 720. An interconnect structure 730 is surrounded by the packaging material 720, where the interconnect structure 730 includes a plurality of metal lines and vias that are used to electrically couple the IC die 701 to the IC die 702. The bridge die 710 provides further electrical connections between the IC dies 701 and 702. For example, an interconnect structure 740 that includes further metal lines and vias is formed over and in the bridge die 710. At least some of the metal lines of the interconnect structure 740 may be located within the bridge die 710. The electrical connections between the IC dies 701 and 702 may be routed at least in part through the metal lines and vias of the interconnect structure 740 (and thus through the bridge die 710). Again, the mismatch in the surface orientations between the substrates of the IC dies 701-702 and the bridge die 710 helps to reduced defects, increase yield, and/or improve device performance.

Figure 11:
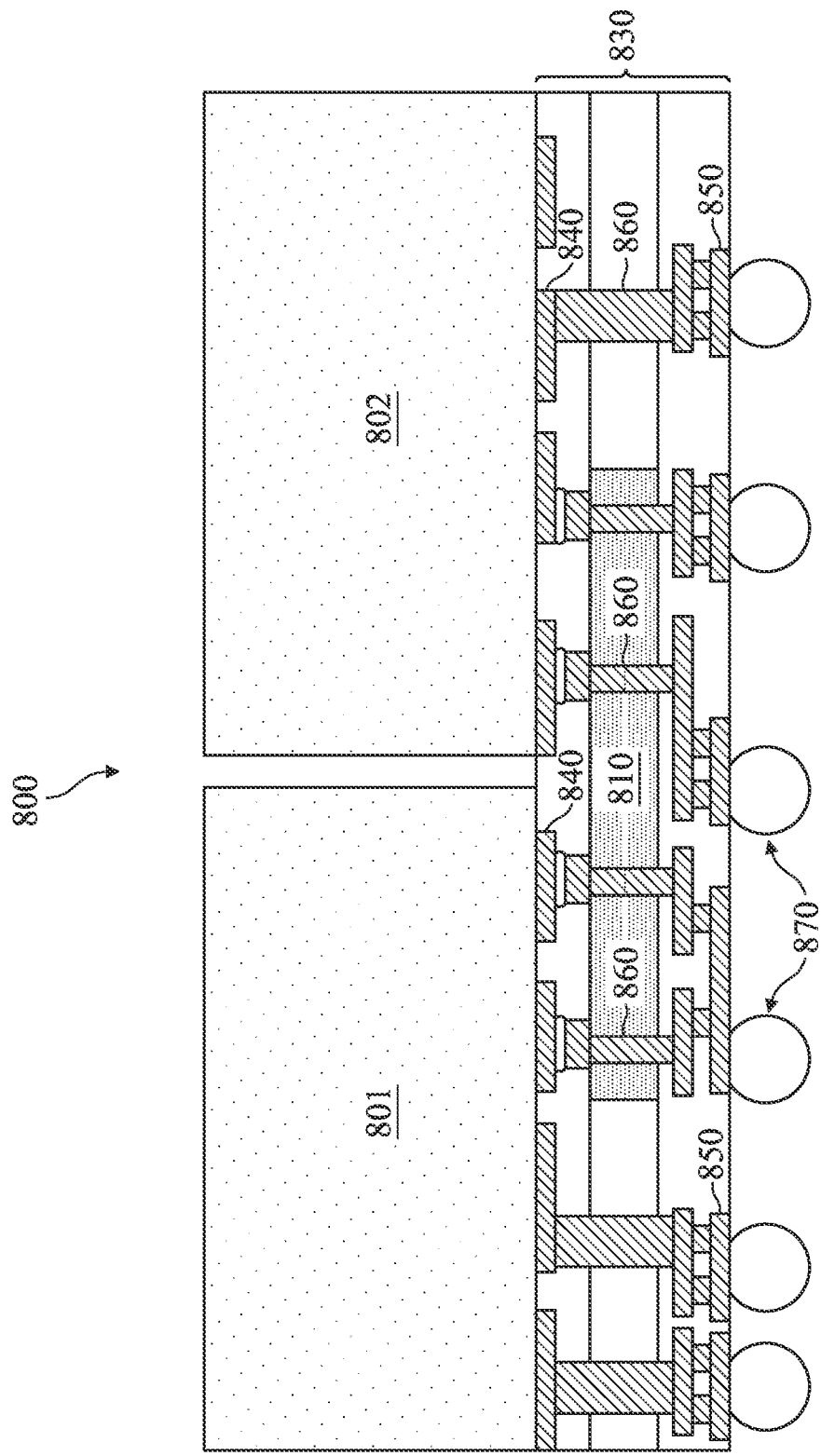
FIG. 11 illustrates a cross-sectional side view of yet another packaging platform according to various aspects of the present disclosure.

FIG. 11 illustrates a fragmentary cross-sectional side view of another packaging platform 800 in which a bridge die is implemented according to the various aspects of the present disclosure discussed above. The packaging platform 800 includes an IC die 801 and an IC die 802, which may be implemented as embodiments of the IC dies 200A and 200B discussed above, respectively. The IC dies 801-802 may be the same type of IC dies in some embodiments, or they may be different types of IC dies in other embodiments. The IC dies 801-802 are electrically coupled together by a bridge die 810, which may be implemented as an embodiment of the bridge die 300 discussed above.

As shown in FIG. 11, the IC dies 801 and 802 may be disposed over an interconnect structure 830. The interconnect structure 830 may include a plurality of conductive bumps (or bonding pads) 840 on which the IC dies 801 and 802 are disposed. The conductive bumps 840 may be electrically coupled to metal lines 850 of the interconnect structure 830 through conductive vias 860. In some embodiments, the conductive vias 860 may include through-substrate vias (TSV). Note that although some of the conductive vias 860 are illustrated as appearing to extend vertically through the bridge die 810 in FIG. 11, these conductive vias 860 may or may not actually extend through the bridge die 810. For example, these conductive vias 860 may be located "in front" or "behind" the bridge die 810, such that they are actually spaced apart from the bridge die 810, even though that aspect is not readily apparent in the cross-sectional side view of FIG. 11. Regardless, electrical connection features within the bridge die 810 may also be utilized to provide further electrical connections between the IC dies 801 and 802.

A plurality of bonding balls 870 may be implemented on the other side of the interconnect structure 830. Through the bonding balls 870 and the various elements 840/850/860 of the interconnect structure 830, as well as through the electrical connections within the bridge die 810, electrical coupling between the IC dies 801 and 802 may be achieved. Again, the mismatch in the surface orientations between the substrates of the IC dies 801-802 and the bridge die 810 helps to reduced defects, increase yield, and/or improve device performance.

Figure 12:
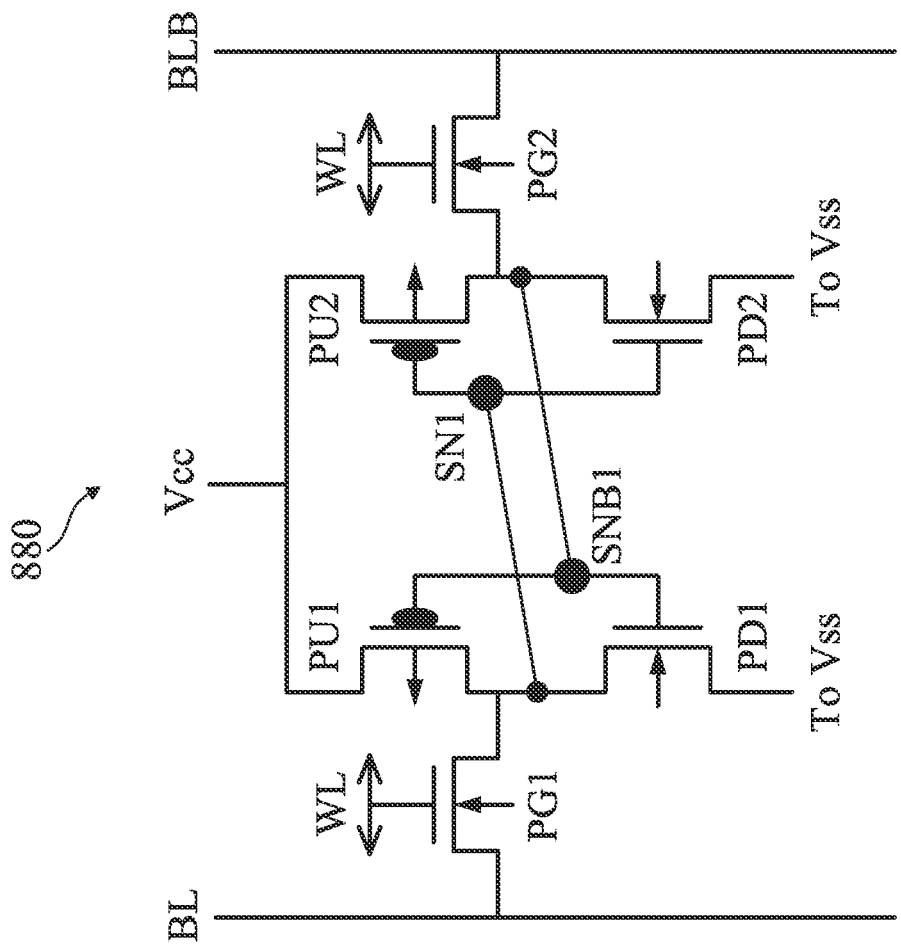
FIG. 12 is a circuit schematic of an SRAM cell according to various aspects of the present disclosure.

As discussed above, the IC dies 200A-200B, 610-613, 620-622, 701-702, and 801-802 may be include a variety of types of IC applications. One type of IC application may be memory devices, such as Static Random-Access Memory (SRAM) devices. In that regard, FIG. 12 illustrates an example circuit schematic for a single-port SRAM cell (e.g., 1-bit SRAM cell) 880. The single-port SRAM cell 880 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 880 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 880 may be implemented using "planar" transistor devices, with FinFET devices, and/or with GAA devices.

Figure 13:
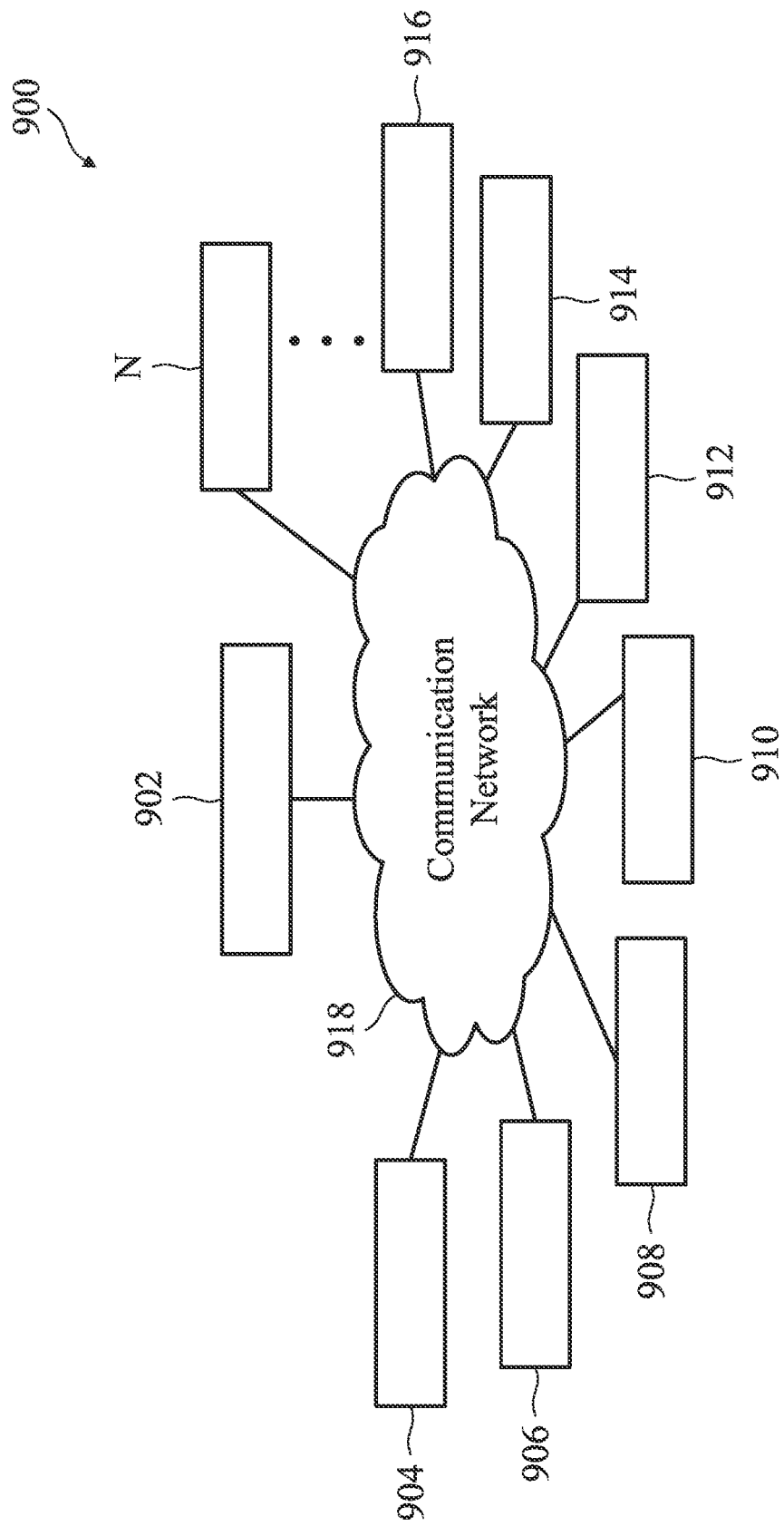
FIG. 13 illustrates an integrated circuit fabrication system according to various aspects of the present disclosure.

FIG. 13 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to perform the various deposition processes discussed above; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 14:
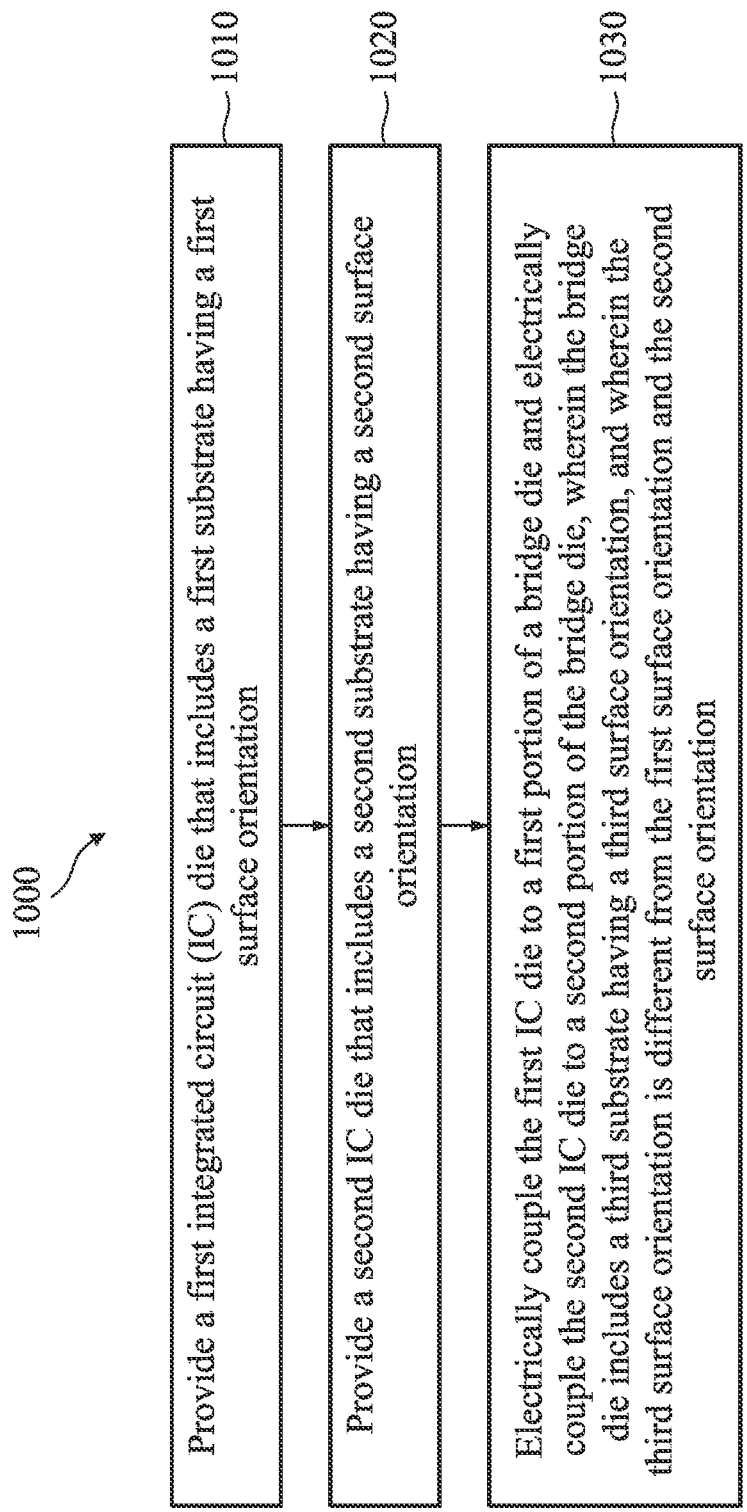
FIG. 14 is a flowchart illustrating a method of fabricating a semiconductor device according to various aspects of the present disclosure.

FIG. 14 is a flowchart illustrating a method 1000 of electrically coupling IC dies together. The method 1000 includes a step 1010 to provide a first integrated circuit (IC) die that includes a first substrate having a first surface orientation.

The method 1000 includes a step 1020 to provide a second IC die that includes a second substrate having a second surface orientation.

The method 1000 includes a step 1030 to electrically couple the first IC die to a first portion of a bridge die and to electrically couple the second IC die to a second portion of the bridge die. The bridge die includes a third substrate having a third surface orientation. The third surface orientation is different from the first surface orientation and the second surface orientation. In some embodiments, the bridge die has a <110> substrate or a <111> substrate. In some embodiments, the bridge die has a quartz substrate or a sapphire substrate. In some embodiments, the bridge die has an amorphous substrate or an organic substrate.

In some embodiments, a plurality of first transistors is formed in the first substrate, and a first interconnect structure is formed over the first substrate. In some embodiments, a plurality of second transistors is formed in the second substrate, and a second interconnect structure is formed over the second substrate. In some embodiments, the step 1030 includes: forming a third interconnect structure over the third substrate, the third substrate containing no transistors; electrically coupling a first portion of the third interconnect structure to the first interconnect structure; and electrically coupling a second portion of the third interconnect structure to the second interconnect structure.

It is understood that additional steps may be performed before, during, or after the steps 1010-1030. For example, the method 1000 may further include additional packaging or testing steps. For reasons of simplicity, these additional steps are not discussed in detail herein.

Based on the above discussions, it can be seen that the present disclosure provides a packaging scheme in which multiple IC dies are electrically coupled together through a bridge die, where the substrates of the IC dies and the bridge die have mismatched (or otherwise different) surface orientations. Such an implementation offers advantages over conventional devices. It is understood, however, that no particular advantage is required, other embodiments may offer different advantages, and that not all advantages are necessarily disclosed herein. One advantage is defect reduction. In more detail, the substrates of the IC dies typically have a semiconductor crystal lattice surface orientation (e.g., one that corresponds to a <100> Miller index). Had the bridge die been implemented to have the same surface orientation, the molecular structural arrangement of the unit cells of the bridge die would have been the same (and extends in parallel with) the IC dies. As such, it would have been easier for a stress applied to the overall structure (comprised of the IC dies and the bridge die) to propagate through the IC dies and the bridge die, thereby causing defects such as cracking or delamination. Here, by configuring the substrate of the bridge die to have a mismatched surface orientation with respect to the substrates of the IC dies, it would take a greater amount of breaking energy to propagate through the IC dies and the bridge die. Consequently, the overall structural integrity is enhanced, and defects such as cracking and delamination are less likely to occur. Device yield and performance may also be improved as a result. Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to a device. The device includes a first integrated circuit (IC) die that includes a first substrate. The device includes a second IC die that includes a second substrate. At least one of the first substrate or the second substrate has a first surface orientation. The first IC die is spaced apart from the second IC die. The device includes a third die that electrically interconnects the first IC die to the second IC die. The third die includes a third substrate having a second surface orientation. The second surface orientation is different from the first surface orientation.

Another aspect of the present disclosure pertains to a device. The device includes a first integrated circuit (IC) die that includes a first semiconductor substrate. The first semiconductor substrate has a crystal lattice structure corresponding to a <100> Miller index. The device includes a second integrated circuit (IC) die that includes a second semiconductor substrate. The second semiconductor substrate has the crystal lattice structure corresponding to the <100> Miller index. The device includes a bridge die that is electrically coupled to both the first IC die and the second IC die. The bridge die: includes a semiconductor substrate that has a crystal lattice structure corresponding to a <110> Miller index or a <111> Miller index, includes a ceramic substrate that contains quartz or sapphire, includes an amorphous substrate, or includes an organic substrate.

Yet another aspect of the present disclosure pertains to a method of fabricating semiconductors. A first integrated circuit (IC) die is provided. The first IC die includes a first substrate having a first surface orientation. A second IC die is provided. The second IC die includes a second substrate having a second surface orientation. The first IC die is electrically coupled to a first portion of a bridge die, and the second IC die is electrically coupled to a second portion of the bridge die. The bridge die includes a third substrate having a third surface orientation. The third surface orientation is different from the first surface orientation and the second surface orientation.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
a first integrated circuit (IC) die that includes a first substrate;
a second IC die that includes a second substrate, wherein a top surface of at least one of the first substrate or the second substrate has a first crystal lattice surface orientation, wherein the top surface spans a horizontal direction, and wherein the first IC die is spaced apart from the second IC die; and
a third die that is coupled to the first IC die and the second IC die in a vertical direction different from the horizontal direction, wherein the third die electrically interconnects the first IC die to the second IC die, wherein the third die includes a third substrate having a second crystal lattice surface orientation is different from the first crystal lattice surface orientation.

2. The device of claim 1, wherein:
the first crystal lattice surface orientation and the second crystal lattice surface orientation define an angle that is between 0 degrees and 90 degrees.

3. The device of claim 2, wherein:
the first crystal lattice surface orientation corresponds to a <100> miller index; and
the second crystal lattice surface orientation corresponds to a <110> miller index.

4. The device of claim 2, wherein:
the first crystal lattice surface orientation corresponds to a <100> miller index; and
the second crystal lattice surface orientation corresponds to a <111> miller index.

5. The device of claim 1, wherein:
the first IC die or the second IC die has a first thickness;
the third die has a second thickness; and
a ratio of the second thickness and the first thickness is in a range between about 5:1 and about 40:1.

6. The device of claim 1, wherein both the first substrate and the second substrate have the first crystal lattice surface orientation.

7. The device of claim 1, wherein:
a plurality of transistors is implemented in the first IC die and the second IC die; and
no transistors are implemented in the third die.

8. The device of claim 1, wherein:
the first IC die includes a first interconnect structure;
the second IC die includes a second interconnect structure;
the third die includes a third interconnect structure;
the first interconnect structure is coupled to a first portion of the third interconnect structure in the vertical direction;
the second interconnect structure is coupled to a second portion of the third interconnect structure in the vertical direction; and
the third die is smaller than the first IC die or the second IC die in a top view.

9. A device, comprising:
a first integrated circuit (IC) die that includes a first semiconductor substrate, wherein an upwardly-facing surface of the first semiconductor substrate has a crystal lattice structure corresponding to a <100> Miller index;
a second integrated circuit (IC) die that includes a second semiconductor substrate, wherein an upwardly-facing surface of the second semiconductor substrate has the crystal lattice structure corresponding to the <100> Miller index; and
a bridge die that is electrically coupled to both the first IC die and the second IC die, wherein the bridge die includes a semiconductor substrate that has a crystal lattice structure corresponding to a <110> Miller index or a <111> Miller index.

10. The device of claim 9, wherein the first IC die and the second IC die each include a plurality of transistors, but the bridge die is free of transistors.

11. The device of claim 9, wherein the first IC die and the second IC die are different types of IC dies.

12. The device of claim 9, wherein:
the first IC die includes a first interconnect structure;
the second IC die includes a second interconnect structure;
the bridge die includes a third interconnect structure;
the first interconnect structure faces toward, and is coupled to, a first portion of the third interconnect structure; and
the second interconnect structure faces toward, and is coupled to, a second portion of the third interconnect structure.

13. The device of claim 9, wherein in a top view, the bridge die has a shorter size than the first IC die and the second IC die.

14. A method, comprising:
providing a first integrated circuit (IC) die that includes a first substrate, wherein a surface of the first substrate that faces a vertical direction has a first crystal lattice surface orientation;
providing a second IC die that includes a second substrate, wherein a surface of the second substrate that faces the vertical direction has the first crystal lattice surface orientation; and
electrically coupling the first IC die to a first portion of a bridge die and electrically coupling the second IC die to a second portion of the bridge die, wherein the bridge die includes a third substrate, wherein a surface of the third substrate that faces the vertical direction has a second crystal lattice different from the first crystal lattice surface orientation.

15. The method of claim 14, further comprising: providing a die having a <110> substrate or a <111> substrate as the bridge die.

16. The method of claim 14, wherein:
the providing the first IC die includes forming a plurality of first transistors in the first substrate and forming a first interconnect structure over the first substrate;
the providing the second IC die includes forming a plurality of second transistors in the second substrate and forming a second interconnect structure over the second substrate; and
the electrically coupling includes:
forming a third interconnect structure over the third substrate, the third substrate containing no transistors;
electrically coupling a first portion of the third interconnect structure to the first interconnect structure; and
electrically coupling a second portion of the third interconnect structure to the second interconnect structure.

17. The method of claim 14, wherein after the electrically coupling, the first IC die and the second IC die are spaced apart from one another in a horizontal direction perpendicular to the vertical direction.

18. The method of claim 14, wherein the first crystal lattice surface orientation is associated with a <100> miller index.

19. The method of claim 14, wherein:
the vertical direction is orthogonal to a horizontal plane defined by a first horizontal direction and a second horizontal direction;
the electrically coupling is performed such that the first IC die and the second IC die are separated from one another in the first horizontal direction; and
the bridge die has a smaller dimension than the first IC die or the second IC die in the second horizontal direction.

20. The method of claim 14, further comprising:
forming a first interconnect structure over the first substrate;
forming a second interconnect structure over the second substrate; and
forming a third interconnect structure over the third substrate;
wherein the electrically coupling includes electrically coupling the first interconnect structure with a first portion of the third interconnect structure and electrically coupling the second interconnect structure with a second portion of the third interconnect structure.

* * * * *